United States Patent [19]

Matsui et al.

[11] Patent Number: 5,151,773
[45] Date of Patent: Sep. 29, 1992

[54] ELECTRONIC CIRCUIT APPARATUS COMPRISING A STRUCTURE FOR SEALING AN ELECTRONIC CIRCUIT

[75] Inventors: Kiyoshi Matsui; Ryohei Satoh, both of Yokohama; Toshitada Netsu, Hatano; Hideaki Sasaki, Hatano; Mitugu Shirai, Hatano; Kenichi Hamamura, Hatano, all of Japan

[73] Assignee: Hitachi, Ltd., Tokyo, Japan

[21] Appl. No.: 676,389

[22] Filed: Mar. 28, 1991

[30] Foreign Application Priority Data

Mar. 30, 1990 [JP] Japan .................................. 2-80712

[51] Int. Cl.⁵ ..................... H01L 23/02; H01L 23/12; H01L 39/02
[52] U.S. Cl. ......................................... 357/74; 357/80; 174/50.52
[58] Field of Search ...................... 357/72, 74, 80, 81; 174/50.2, 50.3, 50.4

[56] References Cited

FOREIGN PATENT DOCUMENTS

| | | | |
|---|---|---|---|
| 58-68951 | 4/1983 | Japan | 357/72 |
| 62-37950 | 2/1987 | Japan | 357/74 |
| 62-149155 | 7/1987 | Japan | 357/74 |
| 62-281452 | 12/1987 | Japan | 357/74 |
| 63-219143 | 9/1988 | Japan | 357/72 |

Primary Examiner—Jerome Jackson, Jr.
Assistant Examiner—D. Monin
Attorney, Agent, or Firm—Antonelli, Terry Stout & Kraus

[57] ABSTRACT

An electronic circuit apparatus in which electronic circuit components are mounted to multiwiring substrate or the like for use with electronic circuits such as an LSI are sealed airtight by sealing units. The sealing unit is sealed by an upper board designated as an upper board sealing unit and a side board designated as a side board sealing unit, and the shape of the edge on cross section of the side board is convex or circular. Metallization is applied to solder joint portions between a substrate and a side board and between the side board and the upper board, and a predetermined solder joint height is provided by a support post to effect solder joining.

3 Claims, 10 Drawing Sheets

ELECTRONIC CIRCUIT APPARATUS COMPRISING A STRUCTURE FOR SEALING AN ELECTRONIC CIRCUIT

BACKGROUND OF THE INVENTION

The present invention relates to an electronic circuit apparatus for sealing a multiwiring substrate with LSI and the like mounted thereon.

The objects for sealing the electronic circuit apparatus includes the follows:

(1) To cut off a LSI, wirings and the like on the multilayer interconnection substrate (multiwiring substrate for short) from the external atmosphere to prevent corrosion, and entry of foreign matter.

(2) To obtain an airtight seal, replacing the internal atmosphere with inert gas having a good thermal condcutivity, and transmit the generated heat from LSI to outside to cool chips.

It is a requirement that the sealing life of the seal is longer than the product life of the electronic circuit apparatus. FIG. 1 is a sectional view of a conventional electronic circuit apparatus having a sealing member with LSI mounted thereon. Reference numeral 1 designates a ceramic substrate, which is a multiwiring substrate formed with a wiring layer consisting of conductors such as W and Mo. Reference numeral 4 designates an LSI chip which is connected to a wiring of the ceramic substrate 1 by a method such as wire bond, tape carrier, CCB (Controlled-Collapse Bonding). Reference numeral 3 designates an input/ output pin connected to the ceramics substrate 1 by soldering. Reference numeral 5 designates a sealing metal cap, which is normally formed of 42% alloy (Fe-Ni 42% alloy), cobalt and the like. The cap 5 is adhered onto a metallized portion 2 applied to the periphery of the surface of the ceramic substrate 1 by a soldering material 6 of AuSn, silver solder or the like. Similar sealing members are discussed in NIKKEI ELECTRONICS, Mar. 26, 1984, page 178 to 184.

The aforementioned prior art has the following problems.

(1) The connection life of a sealing portion is determined by the consumption power of LSI, a heat release value determined by the number of LSIs mounted on the ceramics substrate, a material of the cap and the material of solder, and the size of the ceramics substrate. That is, when a temperature of the ceramics substrate rises from $T_1$ to $T_2$ due to the heat generation of LSI, an expansion by $\Delta l$ ($\alpha l = \Delta \alpha \cdot \Delta T \cdot l$) as shown in FIG. 2 occurs from an original length l due to the thermal expansion of the ceramics substrate. Because the material solder is softer than the 42% alloy used for the metal cap, a large stress and strain in the material of solder 6 is produced principally in the corner portion 7 of the cap 5. The stress and strain produced are repeated by the ON/OFF operation of LSI, and the sealing portion finally becomes cracked due to the thermal fatigue, losing its function. As the ceramics larger, substrate becomes the stress and strain with respect to the sealing portion also increases; thus a long life of the sealing portion cannot be guaranteed.

(2) Since flux (surface active agent) or the like is used when the cap and the ceramics substrate are connected by the solder, and when the shape of the connection portion hardly flat, the flux is escaped outside the solder, and as the flux is once introduced, a void 8 tends to occur within the solder as shown in FIG. 3. This void 8 reduces the thermal fatigue life of the sealing portion.

SUMMARY OF THE INVENTION

The object of the present invention is to eliminate the described above mentioned problems with respect to prior art and to provide an apparatus capable of sufficiently obtaining a long sealing life of an electronic circuit apparatus with a sealed multiwiring.

To achieve the aforementioned object, a sealing unit is divided into an upper board and a side board.

In addition, the shape of the edge on cross section of the sealing unit is a convex shape (including a disk-like shape).

The soldered connection portion of the side board is subjected to metallizing, and in the soldered connection portion between the upper board and the side board and between the side board and the multiwiring substrate, a column is provided at a position about 15% or more with respect to a side length of the multiwiring substrate from four corners of either the upper board, side board or multiwiring substrate to provide a predetermined solder joint height (including a spacing. The same is true for the following).

By dividing the sealing unit into the upper board side and the side board side, a plurality of solder joints can be provided on the sealing body. Therefore, a concentration of stress and strain due to the thermal, expansion of the ceramics substrate can be distributed at the plurality of solder joints.

Since the end of the sealing body is a convex shape, the strain produced in the solder joint is less than that of the flat-shaped end. Furthermore, since the end of the sealing body is made to be a convex shape, the void produced in the solder joint during soldering can be discharged outside.

Since the solder joint is at a height higher than a normal level, a position of support point of the side board can be moved into the solder joint, and occurrence of local stress and strain at the solder joint can be prevented.

The column for obtaining the height of the solder joint is located away from four corners at which the maximum strain is produced whereby the joint life of the solder joint can be considerably extended.

DESCRIPTION OF THE PREFERRED EMBODIMENTS

Figure 1:
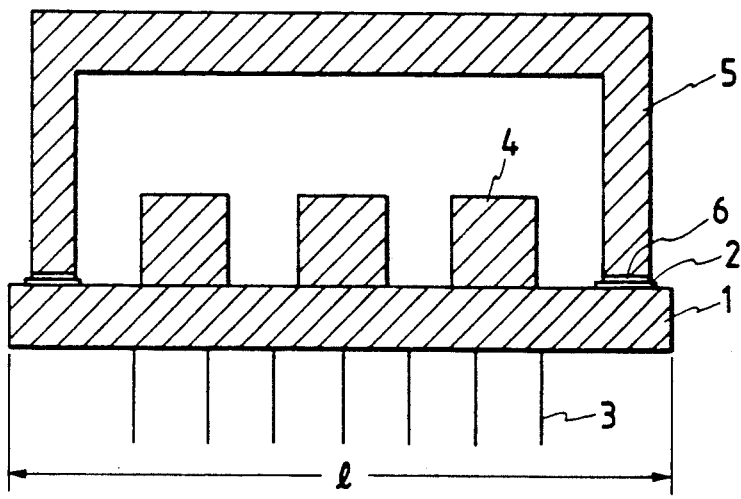
FIG. 1 is a sectional view of a conventional electronic circuit apparatus.
Figure 2:
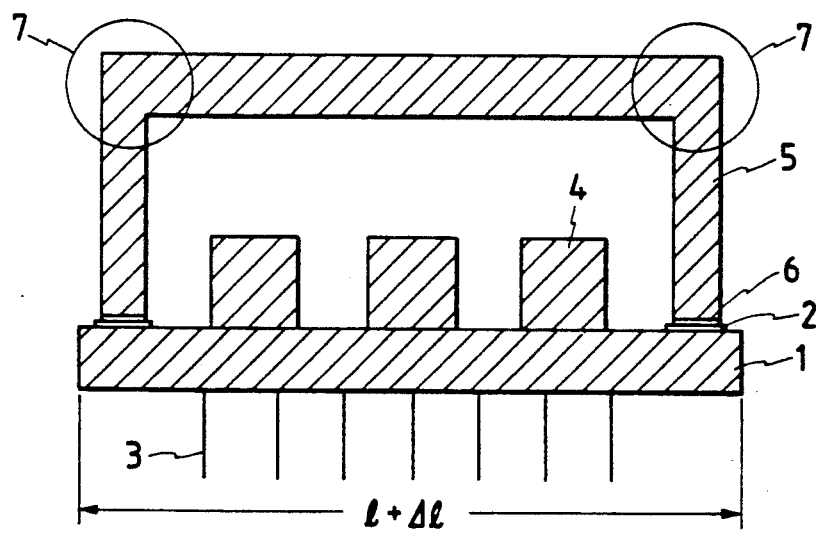
FIG. 2 is a sectional view showing the state where the ceramics substrate is expanded by $\Delta l$ due to the heat generation of the LSI chip.
Figure 3:
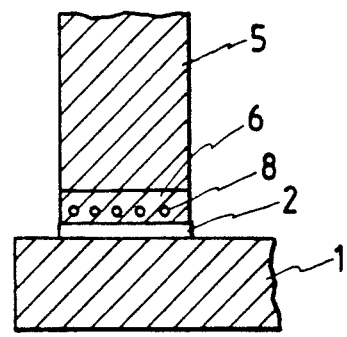
FIG. 3 is a view showing a void produced in the solder joint.
Figure 4:
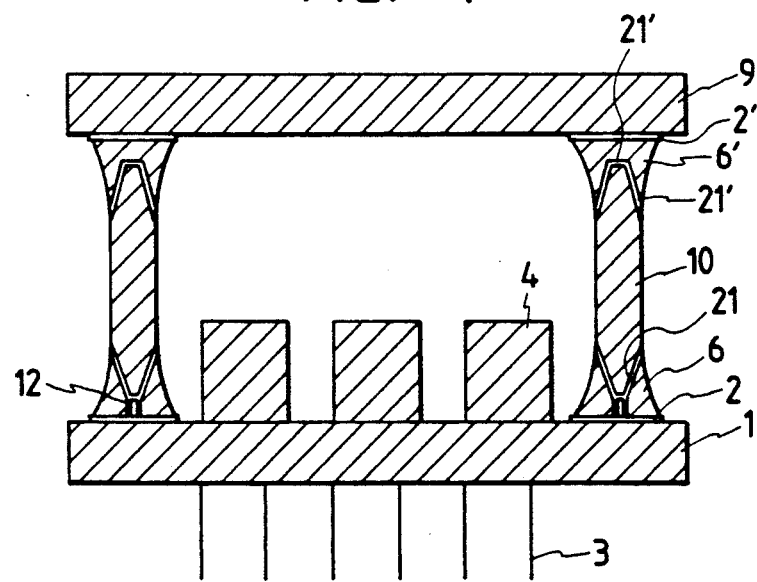
FIG. 4 is a sectional view of an electronic apparatus showing one embodiment according to the present invention.
Figure 13:
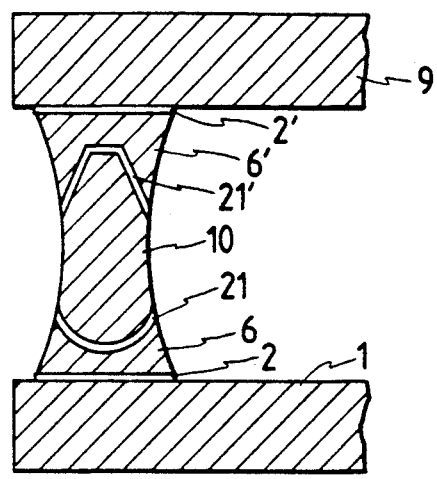
FIGS. 13 to 21 are respectively sectional views showing the structure of essential parts of an electronic circuit apparatus comprising sealing constructions different from each other according to embodiments of the present invention.
Figure 14:
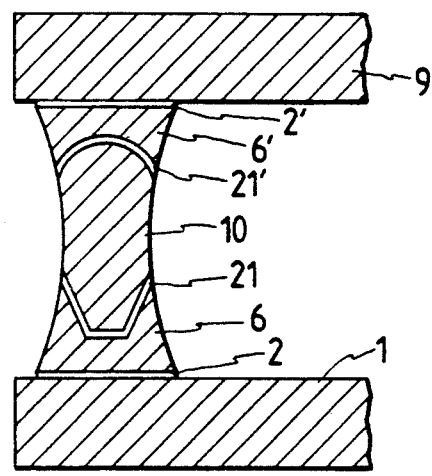
Figure 15:
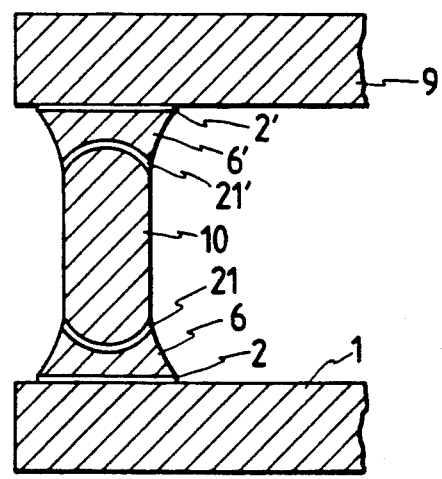
Figure 16:
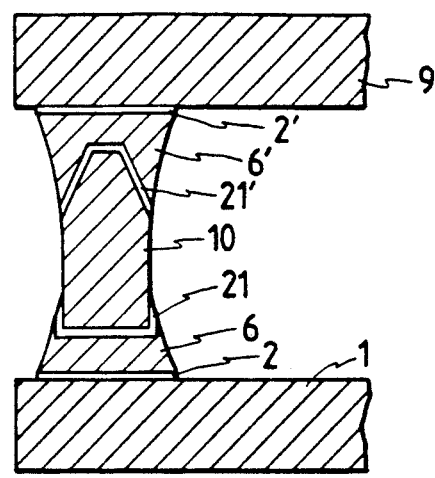
Figure 17:
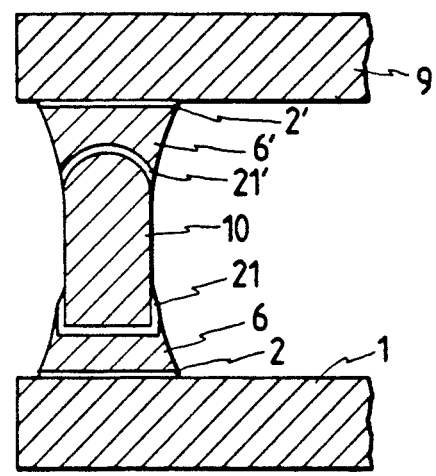
Figure 18:
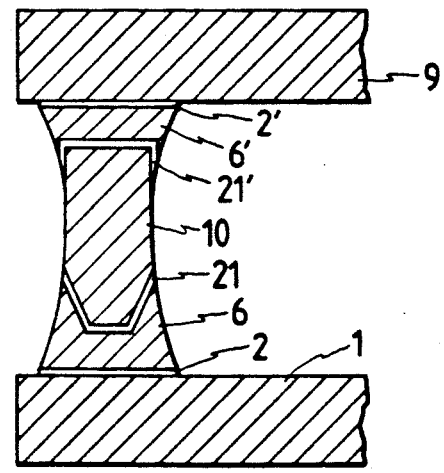
Figure 19:
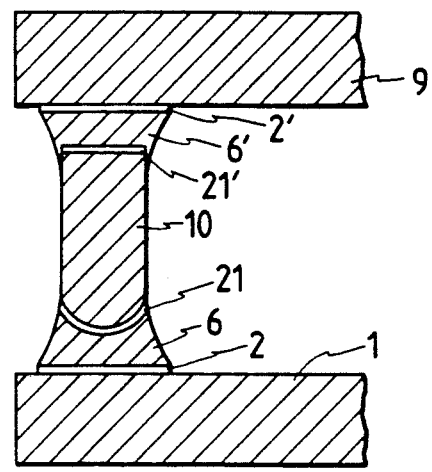
Figure 20:
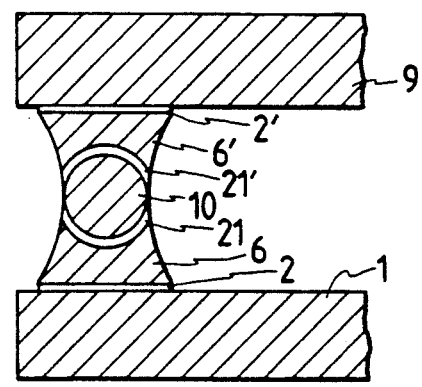
Figure 21:
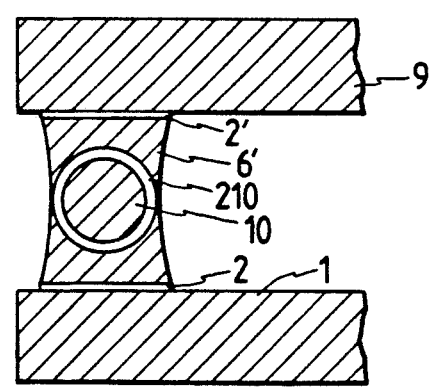

FIG. 4 is a sectional view of an electronic circuit apparatus according to one embodiment of the present invention. In FIG. 4, reference numeral 1 designates a ceramic substrate; 3 designates an input/output pin; 4 designates an ESI; 9 designates a sealing upper board; 10 designates a sealing side board; 6 designates a material of solder for joining between the upper board 9 and the side board 10 and between the side board 10 and the ceramics substrate 1; 2 designates a metallization maintaining a solder joint height. The post 12 may be connected at any position except four corners of the ceramics substrate 1. FIGS. 13 to 21 show embodiments illustrating a sectional shape of a sealing portion composed of the sealing upper board 9, the side board 10, the ceramics substrate 1, the solder 6 and the metalization 2 except the post for maintaining the solder joint height. In FIG. 13, the sectional shape of the solder joint in the side board 10 is convex in the upper portion and circular in the lower portion; in FIG. 14, the sectional shape of the solder joint in the side board 10 is circular in the upper portion and convex in the lower portion; in FIG. 15, the sectional shape of the solder joint is circular in the upper portion and circular in the lower portion; in FIG. 16, the sectional shape of the solder joint in the side board 10 is convex in the upper portion and flat in the lower portion; in FIG. 17, the sectional shape of the solder joint is circular in the upper portion and flat in the lower portion; in FIG. 18, the sectional shape of the solder joint in the side board 10 is flat in the upper portion and convex in the lower portion; in FIG. 19, the sectional shape of the solder joint in the side board 10 is flat in the upper portion and circular in the lower portion; and in FIG. 20, the sectional shape of the solder joint is circular in the upper portion and circular in the lower portion. FIG. 20 shows an example in which a part of the solder joint of the circular section is applied with the metalization 2, and FIG. 21 shows an example in which the whole side of the circular section is applied with the metalization and the whole side board 10 is coated with the solder 6.

Figure 5:
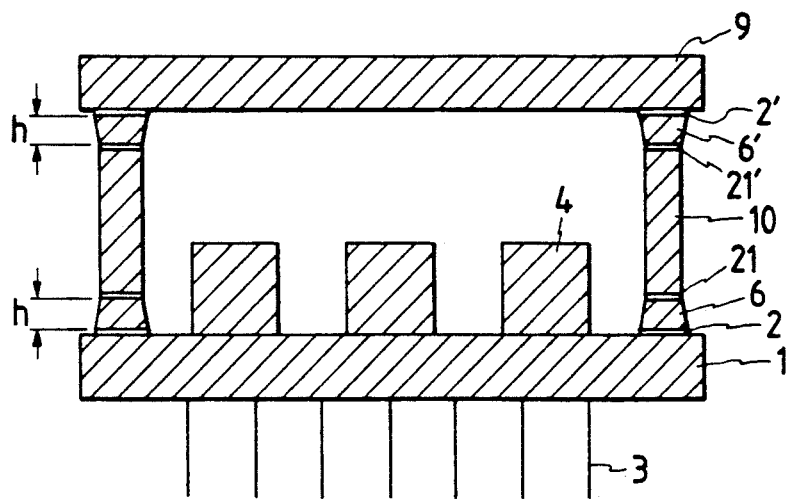
FIG. 5 is a sectional view of an electronic apparatus provided with a solder joint height of an embodiment according to the present invention.
Figure 6:
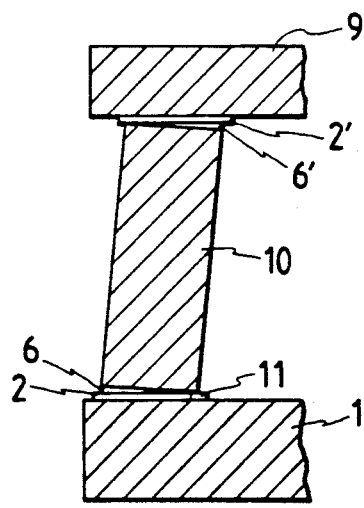
FIG. 6 is a sectioned view in the case where stress and strain are produced in a sealing body of the electronic circuit apparatus.
Figure 7:
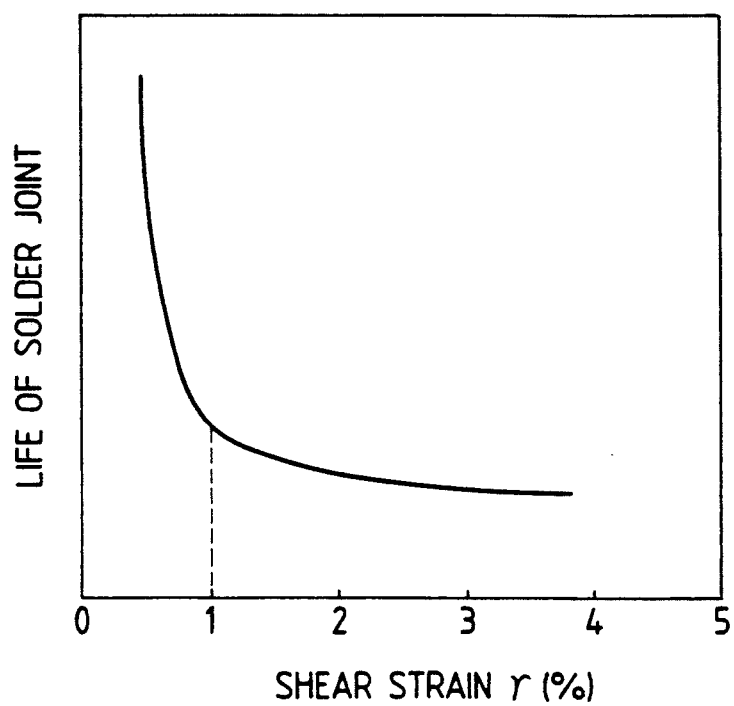
FIG. 7 is a diagram showing the relationship between shear strain and life of solder joint for explaining the present invention.
Figure 8:
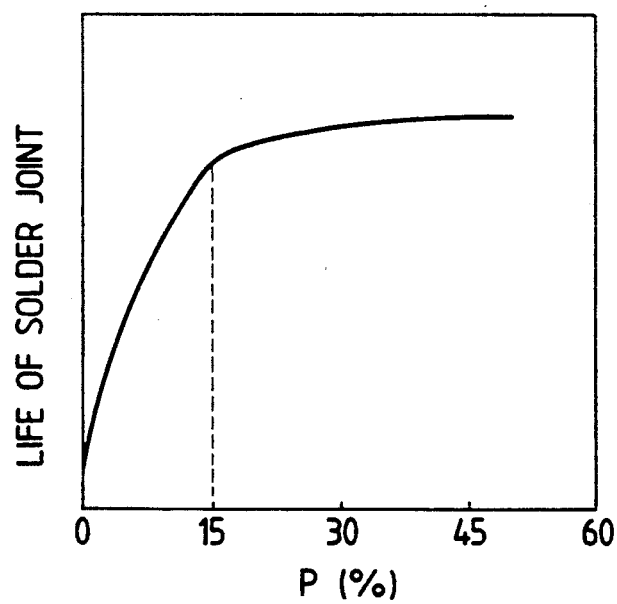
FIG. 8 is a diagram showing the relationship between a support mounting position and life of solder joint for explaining the present invention.

The operation of the apparatus described above will be explained hereinafter. First, heat generated by the operation of the LSI 4 is transmitted to the ceramics substrate 1 to produce a thermal expansion in the ceramics substrate 1. Stress and strain produced at that time are applied to the solders 6, 6', the side board 10 and the upper board 9. However, since the solder joint portion is divided into two parts, one for the ceramics substrate 1/ side board 10 and the other for the side board 10/ upper plate 9, the stress and strain produced in the solder joint portions can be distributed to the respective solder joint portions. By providing a predetermined joint height with the solders 6 and 6' for joining between the ceramics substrate 1 and the side board 10 and between the side board 10 and the upper plate 9, respectively, the stress and strain produced within the solders 6 can be reduced. That is, if the solder joint height (spacing) between the side board 10 and the ceramics substrate 1 and between the upper board 9 and the side board 10 is not present, a bottom 11 of the side board 10 forms a support point with respect to the thermal expansion of the ceramics substrate 1 as shown in FIG. 6, and therefore, locally large stress and strain are produced in the solder 6. In view of this, as shown as a further improvement in FIG. 5, the solder joint portions 6 and 6' of the side board 10 are applied with the metalization 2 to maintains the predetermined joint height h by the joining solders 6 and 6' whereby the support point of the side board 10 with respect to the thermal expansion of the ceramics substrate 1 can be moved into the solder to prevent local stress and strain from being produced. It should be noted that the joint height h is provided in the solder joint portion between the upper board 9 and the side board 10 whereby similar function is brought forth. In a normal state, the solder joint height is a few $\mu$m due to the weight of the upper board 9 and the side board 10. It is therefore necessary that supports such as a spacer, a post 12 and the like are provided within the solder joint to thereby obtain a predetermined joint height h. The h may be obtained from the formula $\gamma = 66 \, \text{l/h}$ where $\gamma$ is shear strain in the solder and $\Delta l$ is displacement of the ceramics substrate 1. The relationship between the $\gamma$ and life of solder joint is shown in FIG. 7 from the experimental results. It has been found that an inflection point of the curve of the life of solder joint is present near $\gamma = 1\%$. Therefore, h which satisfies $\Delta l/h = \gamma = 1\%$ may be obtained. Let m be the distance from the corner of the ceramics substrate 1 to the support mounting position and P be the rate (m/l) between m and a side length l of the ceramics substrate, the relationship between P and the life of solder joint is experimentally shown in FIG. 8. An inflection point of the life of solder joint is present near P = 15%. The support mounting position m should be in the relationship of m $\geq 0.15$ l where l is the length of the side of the ceramics substrate 1.

Figure 9A:
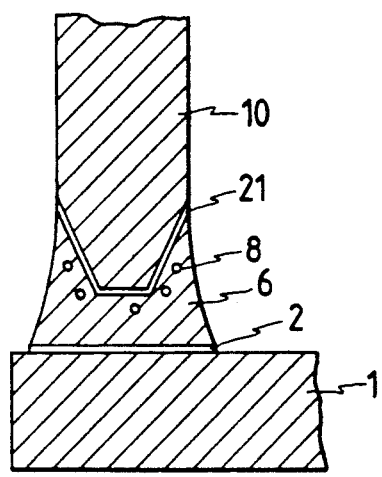
FIGS. 9a and 9b are respectively views showing the state where a void is discharged for explaining the present invention.
Figure 9B:
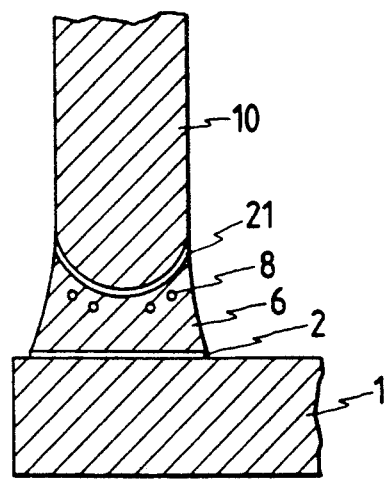
Figure 10:
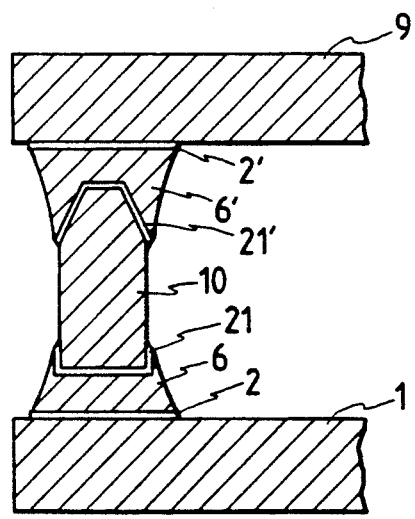
FIG. 10 is a view of analyzing equivalent strain produced in a section of solder.
Figure 11:
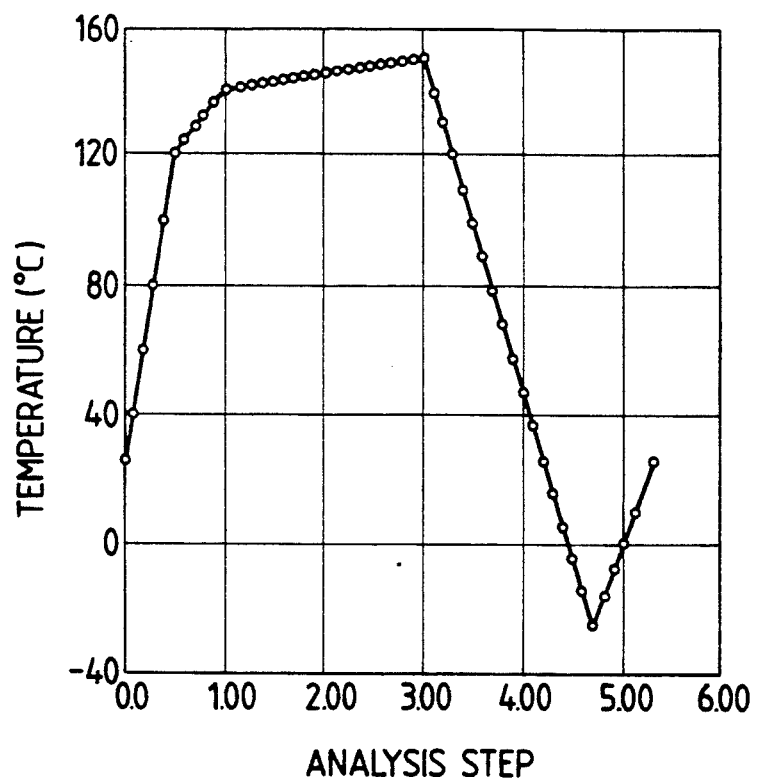
FIG. 11 is a diagram view obtained by analyzing the equivalent strain produced in the section of solder.
Figure 12A:
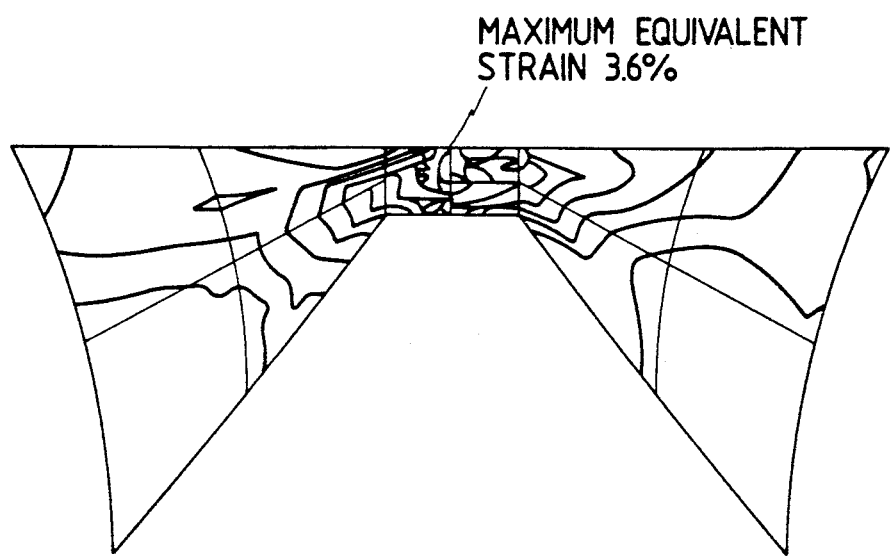
FIGS. 12a and 12b are respectively views showing a distribution of equivalent strain.
Figure 12B:
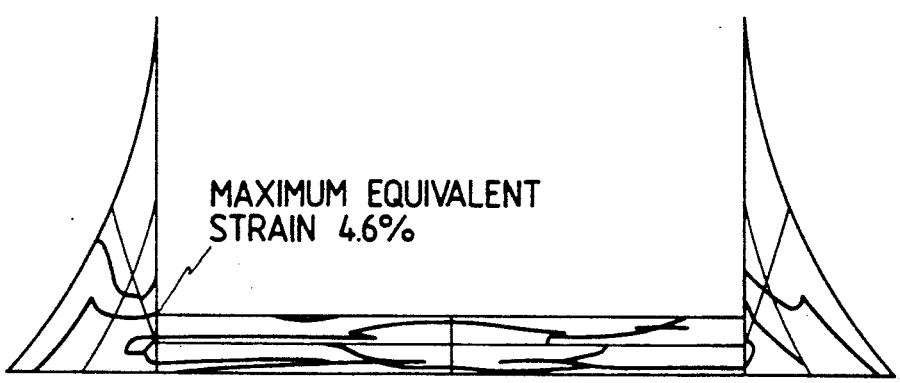

As shown in FIGS. 9a and 9b, the sectional shape of upper and lower portions or one portion thereof of the solder joint portion of the side plate 10 is made convex (including circular shape) whereby an amount of void produced in the solder and an amount of strain produced can be reduced. As shown in FIG. 10, the sectional shape of the solder joint portion of the side board 10 is made to be convex - flat, and 3-dimensional thermo elastic-plastic analysis is carried out to simulate the strain produced in both solder joints. As the result, it was found that equivalent strain produced in the convex shape is less than that of the flat shape. The temperature data used in the simulation is shown in FIG. 11, and the analysis was conducted in the range of temperature of −25 to 150° C. FIG. 11 is a distribution view obtained by analyzing the equivalent strain produced in the section of solder at both joint locations at 150° C. One of parameters used in studying the thermal fatigue life of solder is the maximum value of equivalent strain. It was found that in the convex shape shown in FIG. 12a, the maximum equivalent strain was 3.6%; in the flat shape in FIG. 12b, the maximum equivalent strain was 4.6%, and as the effect given by the joint shape to the strain produced in the solder, about 22% ((4.6−3.6)/4.6) is reduced. Materials used for the simulation are, in FIG. 10, ceramics for the upper board 9 and the multi-substrate 1, Fe-Ni 42% alloy for the side board 10, and Sn-37Pb for the solder 6.

As a method for reducing voids produced in the solder, as shown in FIGS. 9a and 9b, the sectional shape of the solder joint portion of the side board 10 is made to be convex 12 (FIG. 9a) or circular shape (FIG. 9b) whereby the void 8 produced in the solder joint can be discharged outside.

As described above, according to the present embodiment, the change in construction of the cap, and the control of two upper and lower stage solder joints and solder joint height can are carried out whereby the stress and strain produced by the thermal expansion of ceramics substrate can be distributed, the amount of voids produced in the solder can be reduced, and the sealing life caused by the thermal fatigue can be considerably prolonged.

According to the present invention, stress and strain produced in the soldered portions and the sealing cap caused by the thermal expansion of the ceramics substrate can be scattered and reduced. Furthermore, the amount of voids produced in the soldered portion can be reduced to thereby enhance the sealing reliability in the solder joint portion to considerably prolong the sealing life.

What is claimed is:

1. An electronic circuit apparatus comprising a substrate, electronic circuit components mounted on said substrate, and a sealing unit for sealing said electronic components on said substrate, said electronic circuit apparatus further comprising:

a first solder joint portion;
a frame-like first sealing unit connected to said substrate by said first solder joint portion;
a second solder joint portion; and
a second sealing unit connected to said first sealing unit by said second solder joint portion, to enclose said electronic circuit components,
wherein said first sealing unit has at least one shaped end, and
wherein said first solder joint portion includes a first maintaining member for maintaining a predetermined space between said substrate and said first sealing unit, and said second solder joint includes a second maintaining member for maintaining said predetermined space between first sealing unit and said second sealing unit.

2. An electronic circuit apparatus comprising a substrate, electronic circuit components mounted on said substrate, and a sealing unit for sealing said electronic components on said substrate, said electronic circuit apparatus further comprising:

a first solder joint portion;
a frame-like first sealing unit connected to said substrate by said first solder joint portion;
a second solder joint portion;
a second sealing unit connected to said first sealing unit by said second solder joint portion, to enclose said electronic circuit components,
wherein said first sealing unit includes two convex shaped ends, and
wherein said first solder joint portion includes a first maintaining member for maintaining a predetermined space between said substrate and said first sealing unit and said second solder joint portion includes a second maintaining member for maintaining said predetermined space between first sealing unit and said second sealing unit.

3. An electronic circuit apparatus according to one claims 1 or 2, wherein a height of at least said first solder joint portion satisfies the relationship:

$$\gamma l/h = \Delta \leq 1\%,$$

wherein:
h = the height of at least said first solder joint portion;
$\gamma$ = a shear strain; and
$\Delta l$ = a displacement of said substrate due to thermal expansion of said substrate; and
wherein said first and second maintaining member are positioned on said substrate in accordance with the following ratio;

$$m/l \geq 15\%.$$

where:
m = a distance from the corner of the substrate to said portion; and
l = a side length of the substrate.

* * * * *